United States Patent
Chih et al.

(10) Patent No.: US 11,353,501 B2
(45) Date of Patent: Jun. 7, 2022

(12)

(54) WAFER INSPECTION METHOD AND WAFER PROBING SYSTEM

(71) Applicant: MPI Corporation, Hsinchu County (TW)

(72) Inventors: Lin-Lin Chih, Hsinchu County (TW); Chien-Hung Chen, Hsinchu County (TW); Guan-Jhih Liou, Hsinchu County (TW); Yu-Hsun Hsu, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 17/094,408

(22) Filed: Nov. 10, 2020

(65) Prior Publication Data

US 2021/0055344 A1 Feb. 25, 2021

Related U.S. Application Data

(63) Continuation-in-part of application No. 16/213,498, filed on Dec. 7, 2018, now Pat. No. 10,976,363.

(60) Provisional application No. 62/599,051, filed on Dec. 15, 2017.

(51) Int. Cl.
   *G01R 31/28* (2006.01)
(52) U.S. Cl.
   CPC ..... *G01R 31/2891* (2013.01); *G01R 31/2887* (2013.01)
(58) Field of Classification Search
   CPC ............ G01R 31/2894; G01R 31/2887; G01R 31/2865
   See application file for complete search history.

(56) References Cited

U.S. PATENT DOCUMENTS

| 5,642,056 A * | 6/1997 | Nakajima .......... G01R 31/2887 324/750.22 |
| 6,024,629 A * | 2/2000 | Takekoshi .......... G01R 31/2887 451/28 |
| 6,501,289 B1 | 12/2002 | Takekoshi |

(Continued)

FOREIGN PATENT DOCUMENTS

| DE | 10 2016 104 400 A | 9/2016 |
| TW | 201516413 A | 5/2015 |

(Continued)

*Primary Examiner* — Akm Zakaria
(74) *Attorney, Agent, or Firm* — Birch, Stewart, Kolasch & Birch, LLP

(57) ABSTRACT

A wafer inspection method, wherein a motorized chuck stage is controlled by a control rod to be displaced between an upper position and a lower position along Z-axis direction, to change a relative position of a wafer on the motorized chuck stage relative to a probe. The control rod is movable between an upper and an lower limit positions. The wafer inspection method includes: determining a position of the control rod based on a measurement signal; determining a first moving direction and a moving distance of the control rod based on a change of the measurement signal; generating a control signal based on the moving distance of the control rod; controlling the motorized chuck stage to be displaced along a second moving direction opposite to the first moving direction; and controlling an objective lens module to keep focusing on the wafer when the motorized chuck stage is on the move.

14 Claims, 11 Drawing Sheets

(56) References Cited

U.S. PATENT DOCUMENTS

| | | | |
|---|---|---|---|
| 7,565,002 B2 | 7/2009 | Yasutomi | |
| 7,897,942 B1 | 3/2011 | Bareket et al. | |
| 2006/0284083 A1* | 12/2006 | Kurenuma | B82Y 35/00 250/309 |
| 2011/0056085 A1 | 3/2011 | Jordil | |
| 2012/0134573 A1 | 5/2012 | Higashio et al. | |

FOREIGN PATENT DOCUMENTS

| | | |
|---|---|---|
| TW | 201643981 A | 12/2016 |
| TW | 201929115 A | 7/2019 |
| TW | 202004204 A | 1/2020 |

* cited by examiner

WAFER INSPECTION METHOD AND WAFER PROBING SYSTEM

CROSS-REFERENCE TO RELATED APPLICATION

This application is a continuation-in-part (CIP) of application Ser. No. 16/213,498, filed on Dec. 7, 2018 claims priority under 35 U.S.C. § 119(e) to U.S. Provisional Patent Application No. 62/599,051, filed on Dec. 15, 2017, the entire contents of which are hereby incorporated by reference.

BACKGROUND

Technical Field

Embodiments of the present invention relate to a semiconductor inspection method and a semiconductor inspection system.

Related Art

With the development of a semiconductor technology, application of integrated circuits is more popular. In a process of making the integrated circuits or after the process is completed, to screen out a defective product, a test signal needs to be transmitted, by using a test apparatus, to an integrated circuit to test whether the integrated circuit meets expectations, to control and manage a delivery yield of the integrated circuits. Herein, in a current test technology, a probe of a probe apparatus may come into direct contact with a pad or an input/output pad (I/O pad) on a to-be-tested circuit (for example, a wafer), the test apparatus sends the test signal to the to-be-tested circuit through the probe for testing, and a test result is returned to the test apparatus through the probe for analysis.

In the currently known test apparatus, when the probe comes into contact with the to-be-tested circuit for inspection, a motorized chuck stage is equipped with the wafer. And the motorized chuck stage can rotate and move along a X-direction, a Y-direction, and a Z-direction. The probe is fixed on the center of a probe platen which is movable along with a longitudinal direction. And the probe platen is disposed above the motorized chuck stage. To execute probing, the motorized chuck stage and a camera keep focusing on the wafer. The probe comes into contact with the pad from top to bottom relative to the to-be-tested circuit on the wafer to complete inspection.

The probe platen also needs to be equipped with other instruments required for testing. During probe testing, the height of the probe often needs to be finely adjusted, and the probe is slightly moved upwards to observe whether a probe trace generated by the probe meets expectations or determine whether the probe exactly comes into contact with the pad. However, it is rather difficult to drive the probe platen bearing a heavy weight to be precisely finely adjusted.

SUMMARY

In some embodiments of the present invention, a wafer inspection method is disclosed. A motorized chuck stage is controlled by a control rod to be displaced between an upper position and a lower position of an adjustment range along a Z-axis direction, to change a relative position of a wafer on the motorized chuck stage relative to a probe. The control rod is movable between an upper limit position and a lower limit position in a displacement range. The wafer inspection method includes: determining a position of the control rod in the displacement range based on a measurement signal; determining a first moving direction and a moving distance of the control rod based on a change of the measurement signal; generating a control signal based on the moving distance of the control rod; controlling, based on the control signal, the motorized chuck stage e to be displaced along a second moving direction opposite to the first moving direction; and controlling, based on the control signal or a displacement of the motorized chuck stage, an objective lens module to keep focusing on the wafer when the motorized chuck stage is on the move.

DETAILED DESCRIPTION

Figure 1:
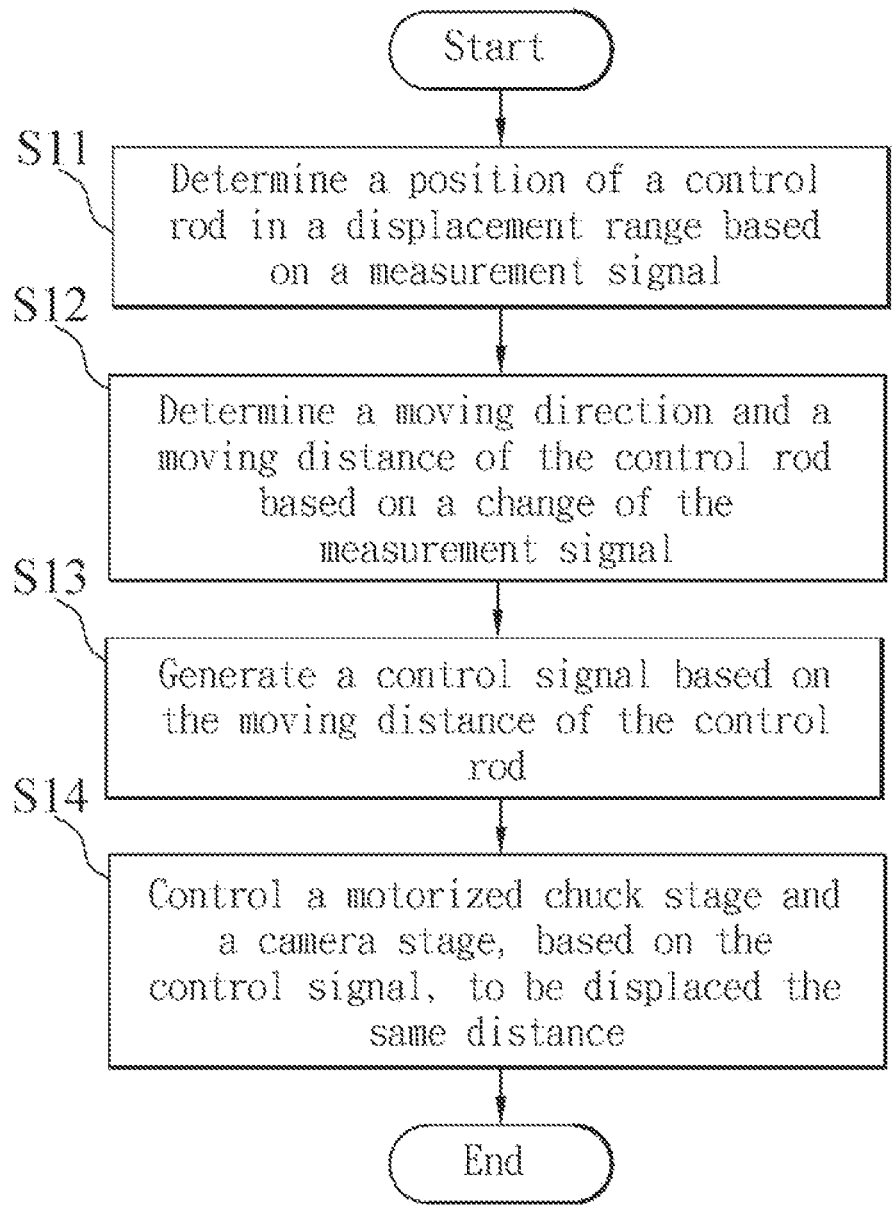
FIG. 1 is a step flowchart of an embodiment of a wafer inspection method according to the present invention.
Figure 2:
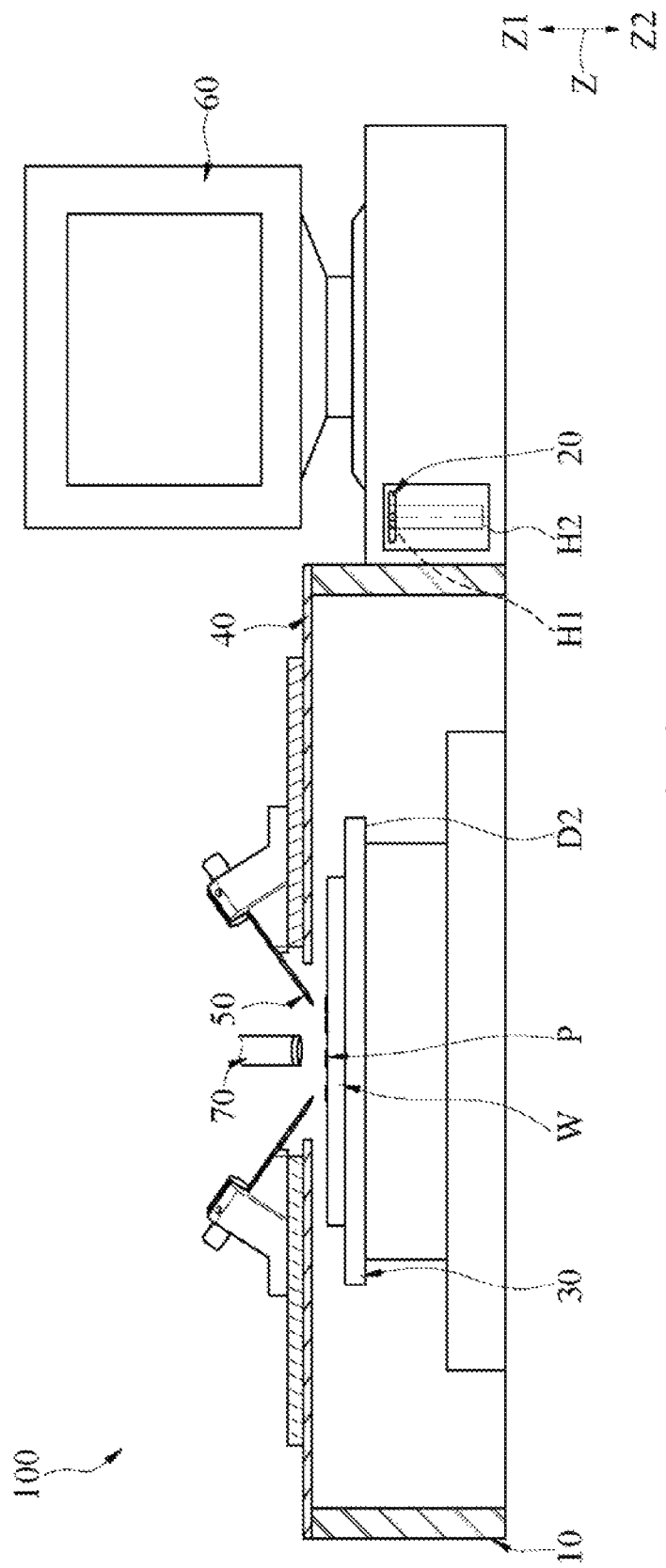
FIG. 2 is a schematic diagram of a wafer probing system for implementing a wafer inspection method.
Figure 3:
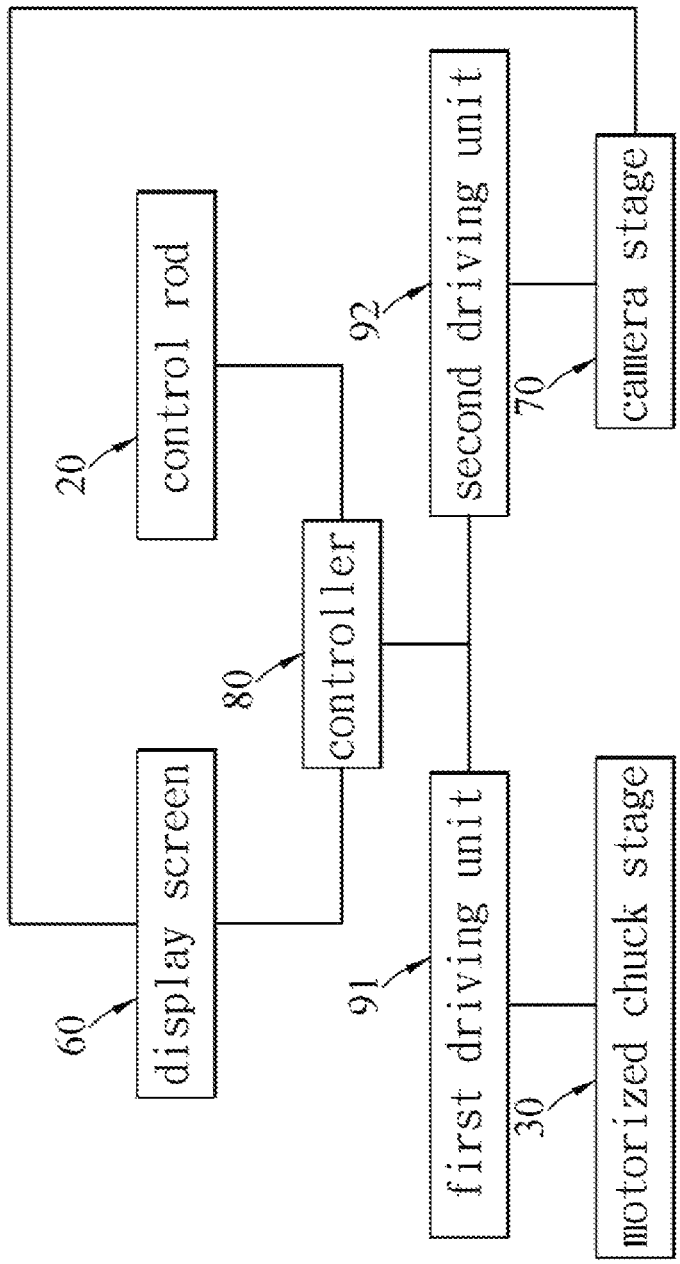
FIG. 3 is a partial schematic diagram of an embodiment of a wafer probing system.
Figure 4:
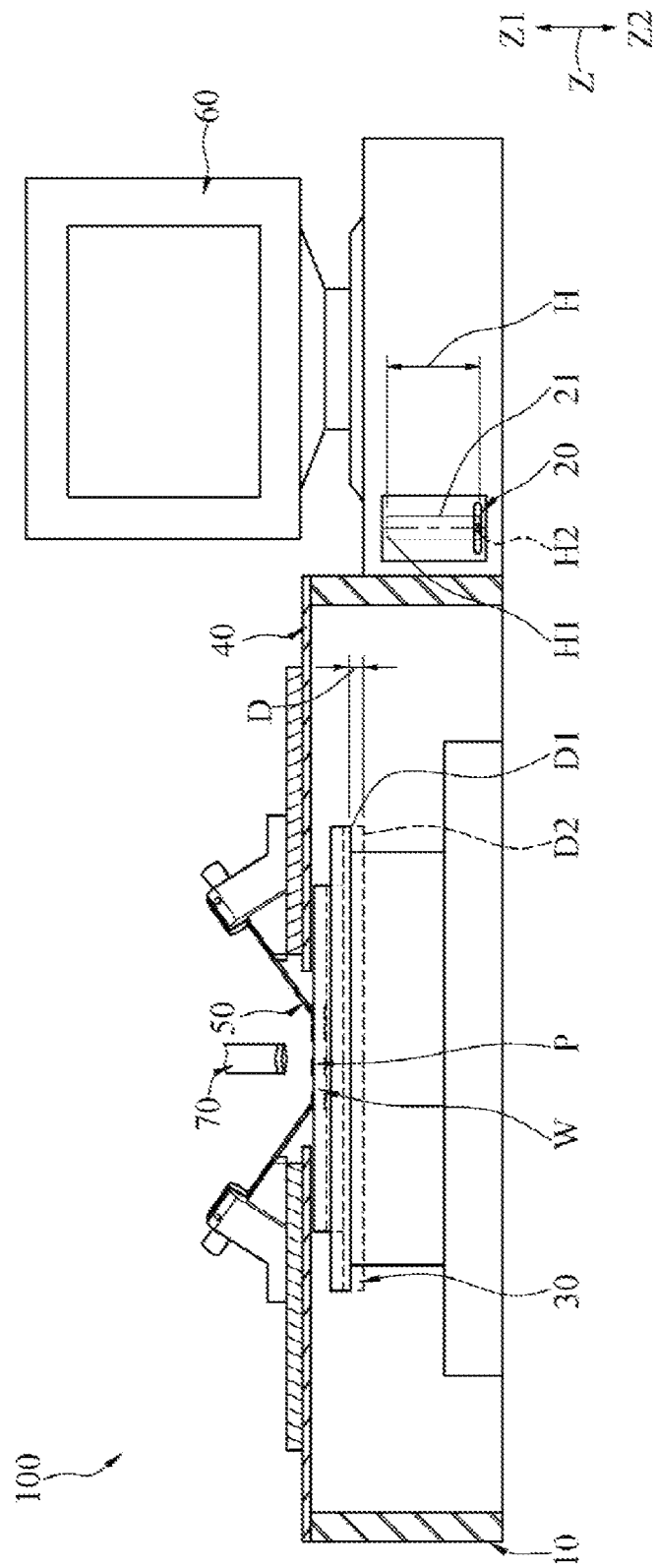
FIG. 4 is another schematic diagram of a wafer probing system for implementing a wafer inspection method.

Referring to FIG. 1 with reference to FIG. 2, FIG. 3, and FIG. 4, FIG. 1 is a step flowchart of an embodiment of a wafer inspection method according to the present invention, and FIG. 2 and FIG. 4 are schematic diagrams of a wafer probing system for implementing a wafer inspection method. FIG. 3 is a partial schematic diagram of an embodiment of a wafer probing system.

A wafer probing system 100 shown in FIG. 2 and FIG. 4 is configured to inspect an electrical condition of a wafer W. In an embodiment, the wafer probing system 100 includes a case 10, a control rod 20, a motorized chuck stage 30, a probe platen 40, a probe 50, a display screen 60, a camera stage 70, a controller 80 and a sensor.

The motorized chuck stage 30 may be disposed to be displaced in the case 10 along a path in a Z-axis direction. The motorized chuck stage 30 is adapted to support the wafer W. The probe platen 40 is fixed on the case 10. The probe 50 is disposed above the motorized chuck stage 30. Specifically, the probe platen 40 is disposed above the motorized chuck stage 30, and the probe 50 is disposed on the probe platen 40. The camera stage 70 is configured to take a picture of the motorized chuck stage 30. Specifically, the camera stage 70 is disposed on the case and faces towards the wafer W to take a picture of the wafer W on the motorized chuck stage 30 when probe testing is performed on the wafer W, to observe a probe testing state. The controller 80 is communicatively coupled to the motorized chuck stage 30 and the camera stage 70. The control rod 20 can be displaced between an upper limit position H1 and a lower limit position H2, and the control rod 20 is electrically connected with the controller 80. The sensor is communicatively coupled to the control rod 20 and the controller 80, when the position of the control rod 20 is changed, the sensor generates a control signal, and the controller 80 is configured to control the motorized chuck stage 30 and the camera stage 70 to move the same distance according to the control signal along the Z-axis direction.

The display screen 60 is communicatively coupled to the camera stage 70. The display screen 60 includes a user interface, the user interface is capable of showing a current position of the motorized chuck stage 30.

In an embodiment, the wafer probing system 100 further includes a first driving unit 91 and a second driving unit 92. The first driving unit 91 is connected with the motorized chuck stage 30. The second driving unit 92 is connected with the camera stage 70. The controller 80 is communicatively coupled to the first driving unit 91, the second driving unit 92, and the control rod 20. The present invention is not limited thereto.

Herein, two ends towards the Z-axis direction are an upper direction Z1 and a lower direction Z2, and the probe platen 40 is located in the upper direction Z1 of the motorized chuck stage 30 relative to the motorized chuck stage 30. In addition, the motorized chuck stage 30 may be displaced along the Z-axis direction to be close to or far away from the probe platen 40, the wafer W on the motorized chuck stage 30 comes into contact with a tip of the probe 50, the tip of the probe 50 comes into contact with the pad P of the wafer W and pierces an oxide layer to form an electrical connection for inspection. Herein, the motorized chuck stage 30 may feed along the Z-axis direction in two stages, and a feed amount along the Z-axis direction in a first stage is greater than a feed amount along the Z-axis direction in a second stage.

Specifically, the wafer probing system 100 may set a displacement amount of the motorized chuck stage 30 along the Z-axis direction in the first stage by using the touch display screen 60. After displacement in the first stage, the motorized chuck stage 30 may be set at a height at which the wafer W comes into contact with the probe 50 and can perform inspection. Herein, this may be referred to as set of an inspection height. Displacement of the motorized chuck stage 30 along the Z-axis direction in the second stage is a fine adjustment distance required for observing, after the height at which the wafer W comes into contact with the probe 50 and performs inspection is set, whether a probe trace of the probe 50 or the tip of the probe 50 is really aligned with the pad P of the wafer W.

Further, in an embodiment, the motorized chuck stage 30 is controlled by the control rod 20 to be displaced along the Z-axis direction, and the control rod 20 may control the motorized chuck stage 30 to be displaced between an upper position D1 and a lower position D2, and a space between the upper position D1 and the lower position D2 is an adjustment range D. Herein, a distance of the adjustment range D needs to be greater than an over drive (OD) of the probe 50 piercing the oxide layer, and when the adjustment range D is greater than the OD, it can be ensured that the displacement of the motorized chuck stage 30 can make the wafer W really get away from the tip of the probe 50.

When the motorized chuck stage 30 changes a position in the adjustment range D, a relative position of the wafer W on the motorized chuck stage 30 relative to the probe 50 can be simultaneously changed. In this way, the tip of the probe 50 gets away from the wafer W to observe the probe trace generated on the pad P in a test process or adjust a position of the tip of the probe 50.

Herein, the control rod 20 is limited to moving in a displacement range H, and the displacement range H extends a length along the Z-axis direction. Therefore, the displacement range H includes an upper limit position H1 and a lower limit position H2 in the Z-axis direction, and the control rod 20 can be displaced between the upper limit position H1 and the lower limit position H2. That is, the displacement range H is defined by a space between the upper limit position H1 and the lower limit position H2. The control rod 20 may be disposed to be displaced in a sliding groove 21 extending along the Z-axis direction, two ends of the sliding groove 21 are the upper limit position H1 and the lower limit position H2, and a length of the sliding groove 21 in the Z-axis direction is the displacement range H. Further, in this embodiment, displacement of the control rod 20 between the upper limit position H1 and the lower limit position H2 can correspondingly control displacement of the motorized chuck stage 30 between the upper position D1 and the lower position D2.

In an embodiment, referring to FIG. 1, FIG. 1 is a step flowchart of using a wafer probing system 100 to perform a wafer inspection method. When inspection is started, first, a position of the control rod 20 is determined based on a measurement signal (step S11). After the position of the control rod 20 is determined, a displacement amount of the motorized chuck stage 30 subsequently controlled to be displaced is defined based on a moving distance of the control rod 20 subsequently operated to move.

Herein, a source of the measurement signal based on which the position of the control rod 20 is determined may be an analog signal or a digital signal. In an embodiment, in a manner of determining the position of the control rod 20 by using the digital signal, a plurality of sensors may be disposed in the displacement range H in which the control rod 20 moves, each sensor is respectively communicatively coupled to the control rod 20 and the controller 80, and each sensor may generate a probing signal corresponding to the position of the control rod 20. The controller 80 is configured to generate a control signal according to the probing signal, the first driving unit 91 and the second driving unit 92 are adapted to control the motorized chuck stage 30 and the camera stage 70 move according the control signal.

For example, when the displacement range H of the control rod 20 is ten centimeters, the sensors may be disposed at positions at intervals of one centimeter in the displacement range H, and each sensor is correspondingly located at different positions of the control rod 20 in the displacement range H. When the control rod 20 is located at the different positions in the displacement range H, the sensor at the position where the control rod 20 is located generates a digital measurement signal, and the position of the control rod 20 in the displacement range H can be determined by using the digital measurement signal. Certainly, when the control rod 20 is displaced, a displacement distance of the control rod 20 may be determined by using a change of the digital measurement signal. The interval between the foregoing sensors and the quantity of the sensors are only examples for ease of description. The present invention is not limited thereto, and may be adjusted based on different using habits or requirements. In an embodiment, the sensor may be a proximity switch.

In an embodiment, in a manner of determining the position of the control rod 20 by using an analog measurement signal, the control rod 20 may be connected to an electronic element that may generate the analog signal corresponding to displacement of the control rod 20. Specifically, the control rod 20 may be connected to an electronic element that may generate a voltage change, a resistance change, a capacitance change, or an inductance change. When the control rod 20 is located at each position of the displacement range H, a corresponding analog measurement signal value may be measured. In a specific embodiment, when the control rod 20 is connected to the electronic element that may generate the voltage change, the control rod 20 may obtain corresponding different voltage values at the positions in the displacement range H through measurement. In this way, detecting the voltage value can determine the position of the control rod 20 in the displacement range H. Certainly, when the control rod 20 is displaced, the moving distance of the control rod 20 may also be learned correspondingly to a change of the voltage value. Herein, a general computer system can read only the digital signal. Therefore, in this embodiment, a measured analog signal may further be converted into a digital signal for the computer system to read and determine the analog signal.

Then, further, when the control rod 20 is operated to move, a moving direction and a moving distance of the control rod 20 is determined based on a change of the measurement signal (step S12). In an embodiment, when the position of the control rod 20 is determined to be located at the lower limit position H2 of the displacement range H, herein a moving distance of the control rod 20 moving towards the upper limit position H1 may be determined.

After the moving distance of the control rod 20 displaced from the lower limit position H2 to the upper limit position H1 is determined based on the change of the measurement signal, a control signal is generated based on the moving distance of the control rod 20 (step S13). Then, the motorized chuck stage 30 and the camera stage 70 are controlled, based on the control signal, to be displaced the same distance (step S14). In this embodiment, the controller 80 is configured to generate the control signal, the first driving unit 91 and the second driving unit 92 are respectively adapted to control the motorized chuck stage 30 and the camera stage 70 to move the same distance according to the control signal. Herein, a distance between the motorized chuck stage 30 and the camera stage 70 is not change after move. In other embodiment, the motorized chuck stage 30 and the camera stage 70 may move simultaneously. The present invention is not limited thereto.

In this embodiment, the control signal based on the moving distance of the control rod 20 displaced from the lower limit position H2 to the upper limit position H1 controls the motorized chuck stage 30 to be displaced from the upper position D1 to the lower position D2. That is, a displacement direction of the control rod 20 is opposite to a direction in which the motorized chuck stage 30 is controlled to be displaced.

More specifically, a relative relationship of correspondingly adjusting the displacement amount of the motorized chuck stage 30 based on the moving distance of the control rod 20 may have different correspondences, as shown in FIG. 5 to FIG. 8. Herein, the different correspondences of correspondingly adjusting the displacement amount of the motorized chuck stage 30 based on the moving distance of the control rod 20 may be software or a program that is written into hardware.

Figure 5:
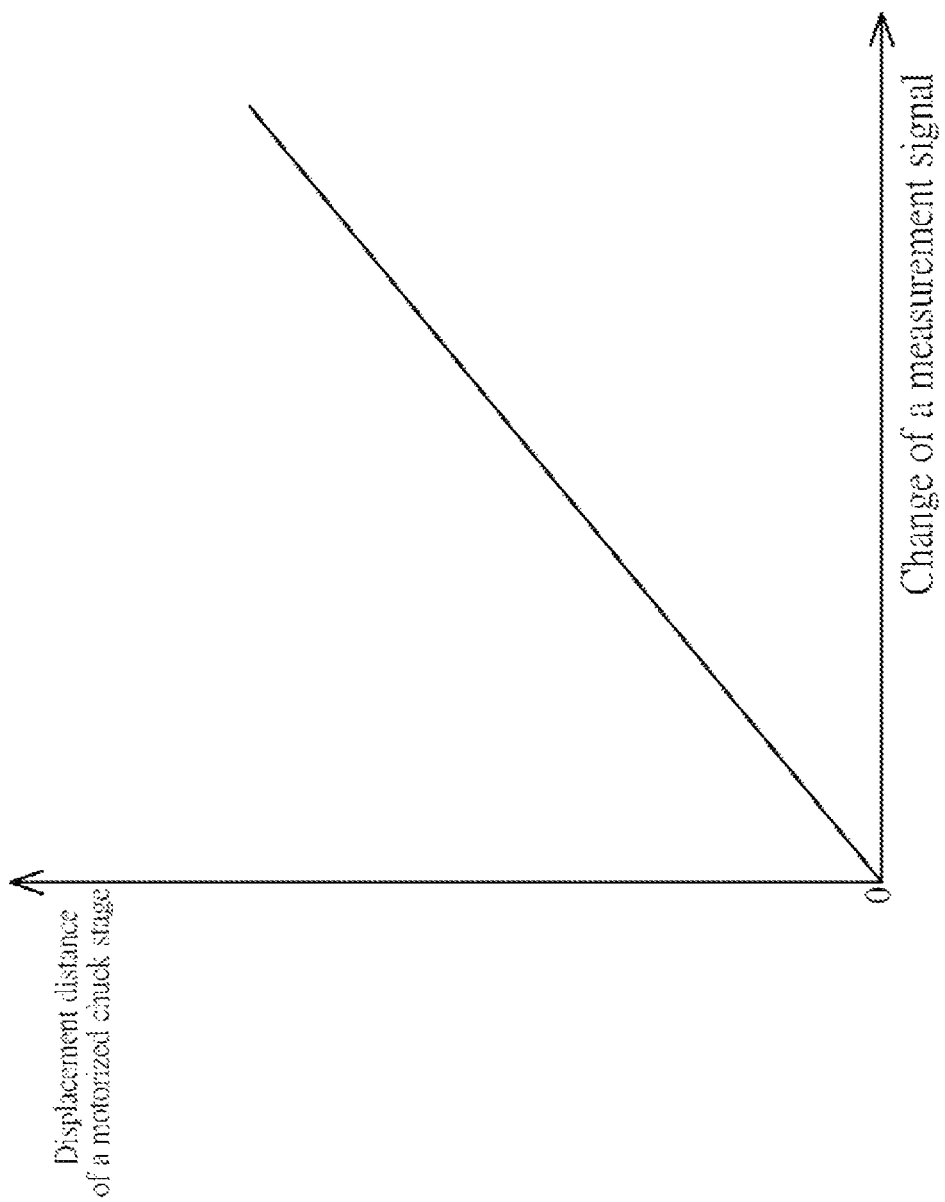
FIG. 5 shows an embodiment of a relative relationship between a change of a measurement signal and a displacement distance of a motorized chuck stage in a wafer inspection method according to the present invention.

Referring to FIG. 5, in an embodiment, there is a linear correlation between a proportion of the moving distance of the control rod 20 in the displacement range H and a proportion of a displacement distance of the motorized chuck stage 30 in the adjustment range D. In a specific embodiment, as shown in FIG. 5, when the control rod 20 is displaced so that the corresponding measurement signal changes, there may be a 1:1 linear correlation between the displacement distance of the motorized chuck stage 30 and the change of the measurement signal corresponding to an movement of the control rod 20. That is, when the operator adjusts the control rod 20 to the lower limit position H2, it may be intuitively considered as the initial position of the motorized chuck stage 30, and adjusting the position of the control rod 20 in the displacement range H may directly correspond to a position ratio of the motorized chuck stage 30 in the displacement range H, thereby facilitating observation and operation of the operator. Certainly, the correspondence between the change of the measurement signal corresponding to the movement of the control rod 20 and the displacement distance of the motorized chuck stage is not limited to a 1:1 linear correlation, and may be changed to 1:2, 2:1 or other proportions based on an environment or a hardware requirement.

Figure 6:
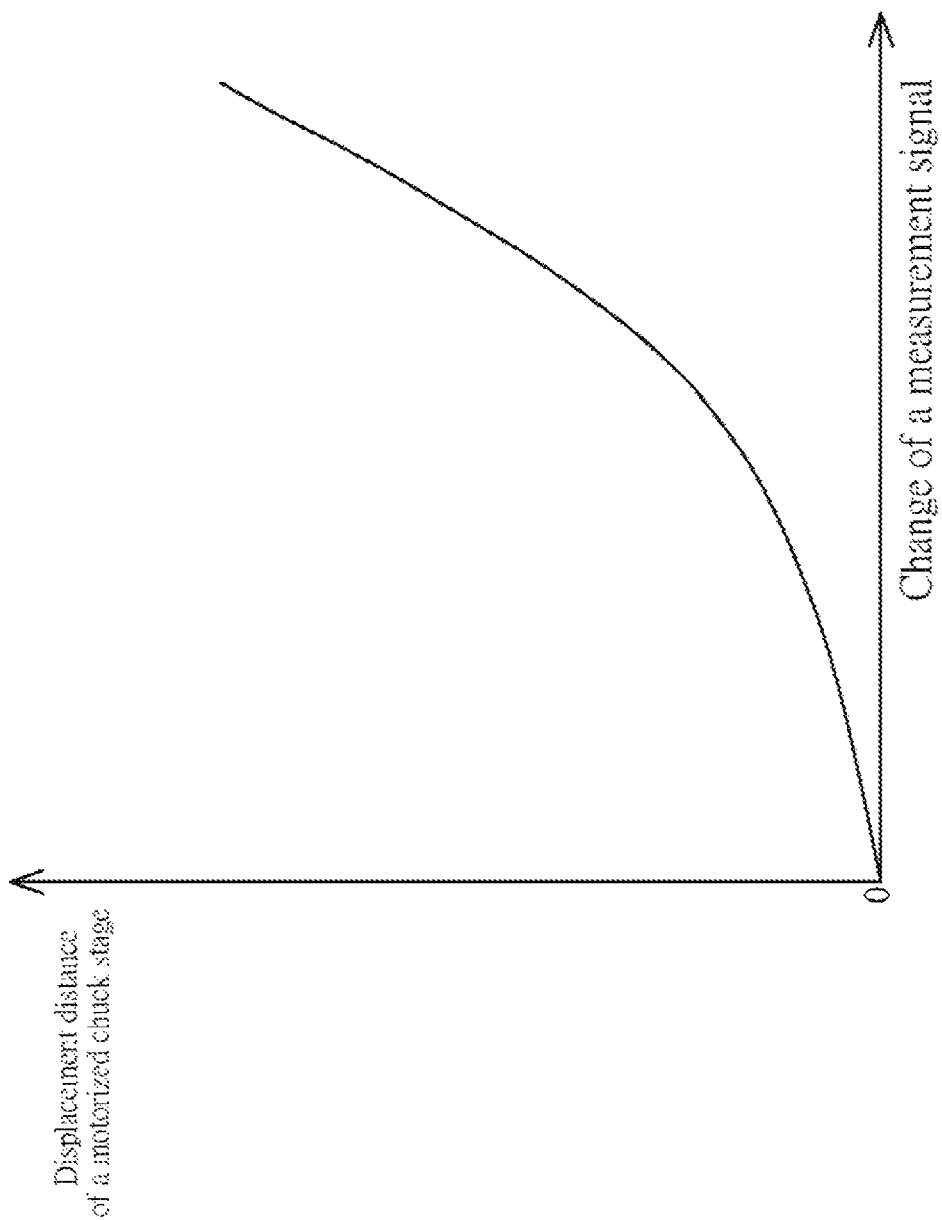
FIG. 6 shows another embodiment of a relative relationship between a change of a measurement signal and a displacement distance of a motorized chuck stage in a wafer inspection method according to the present invention.
Figure 7:
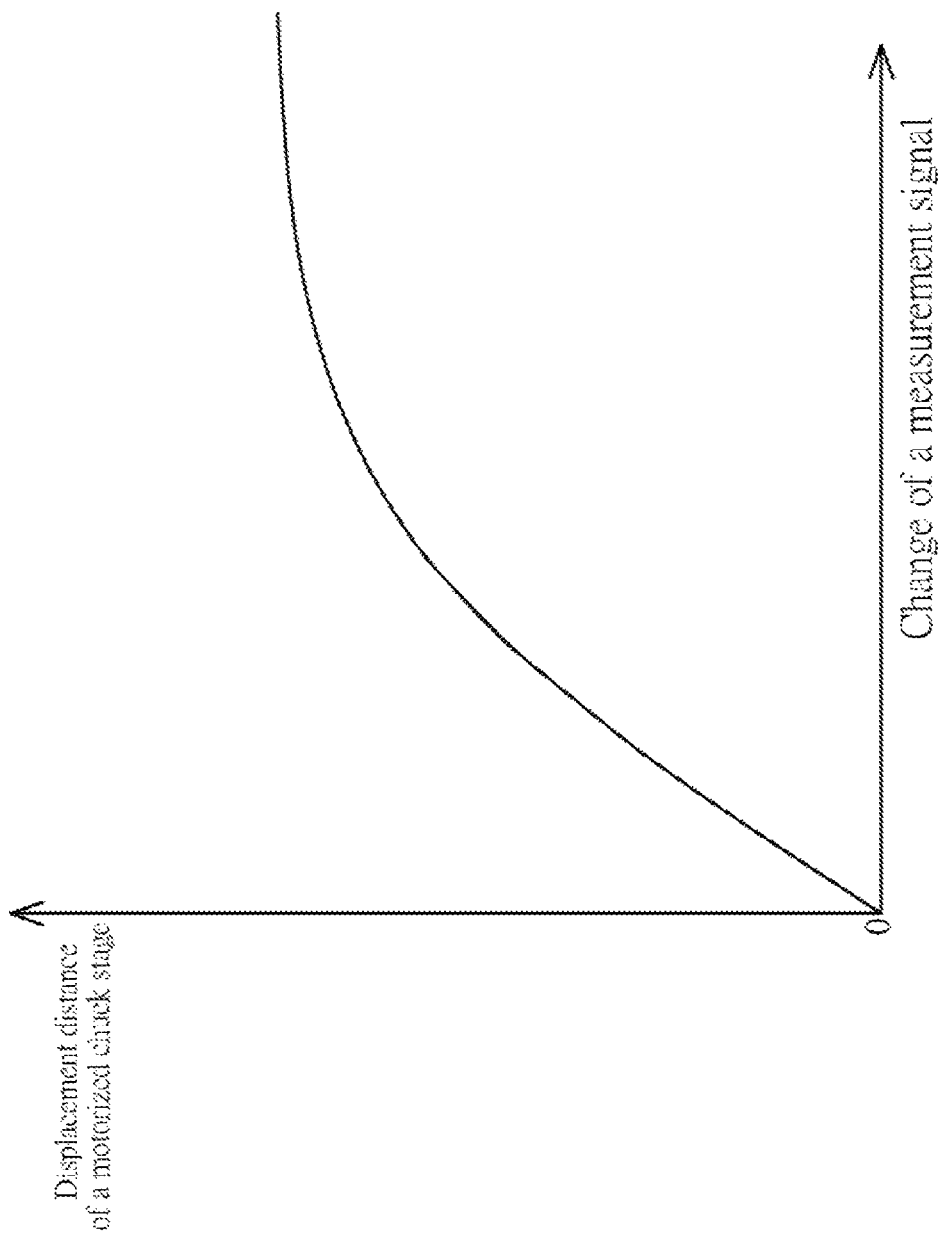
FIG. 7 shows still another embodiment of a relative relationship between a change of a measurement signal and a displacement distance of a motorized chuck stage in a wafer inspection method according to the present invention.
Figure 8:
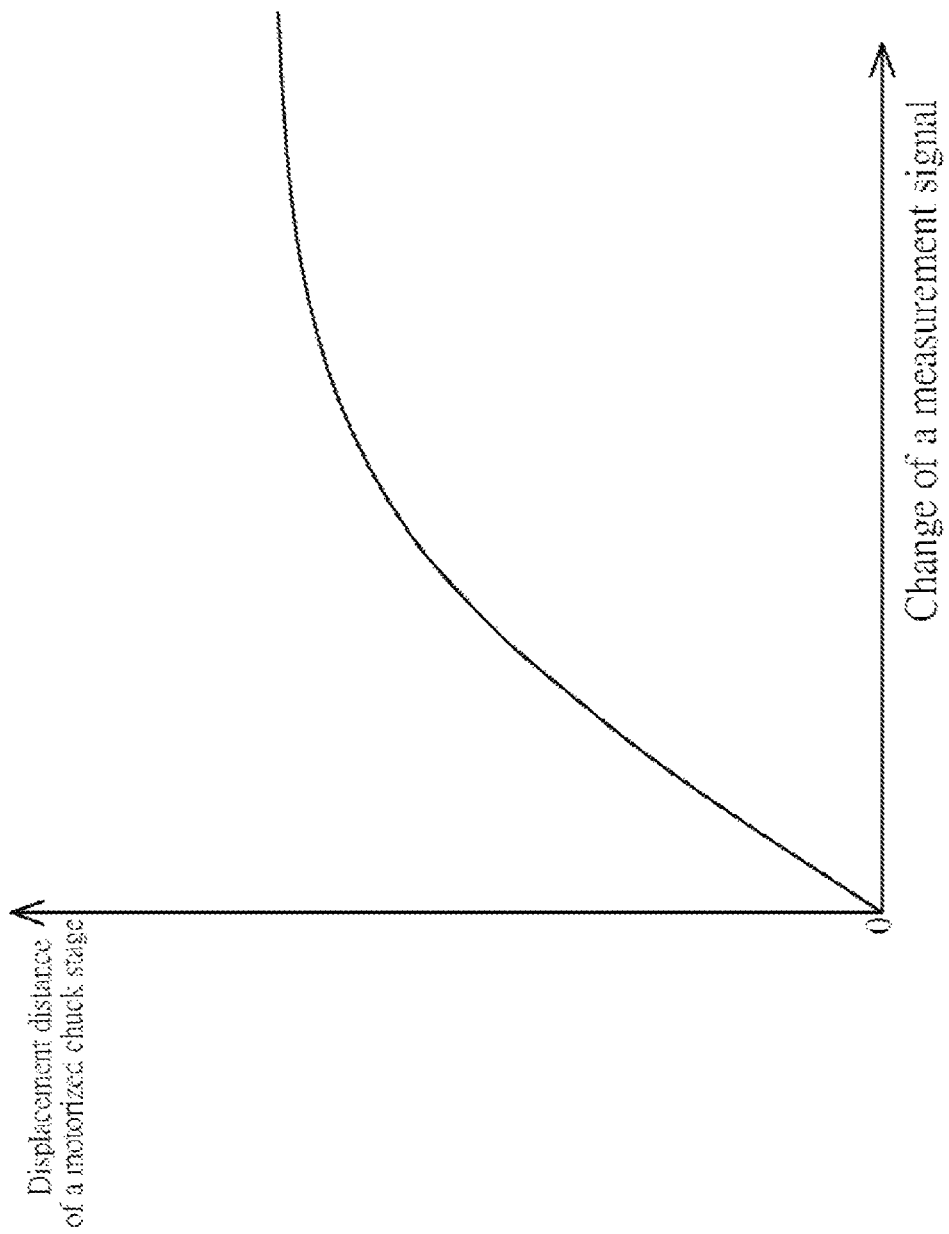
FIG. 8 shows still another embodiment of a relative relationship between a change of a measurement signal and a displacement distance of a motorized chuck stage in a wafer inspection method according to the present invention.
Figure 9:
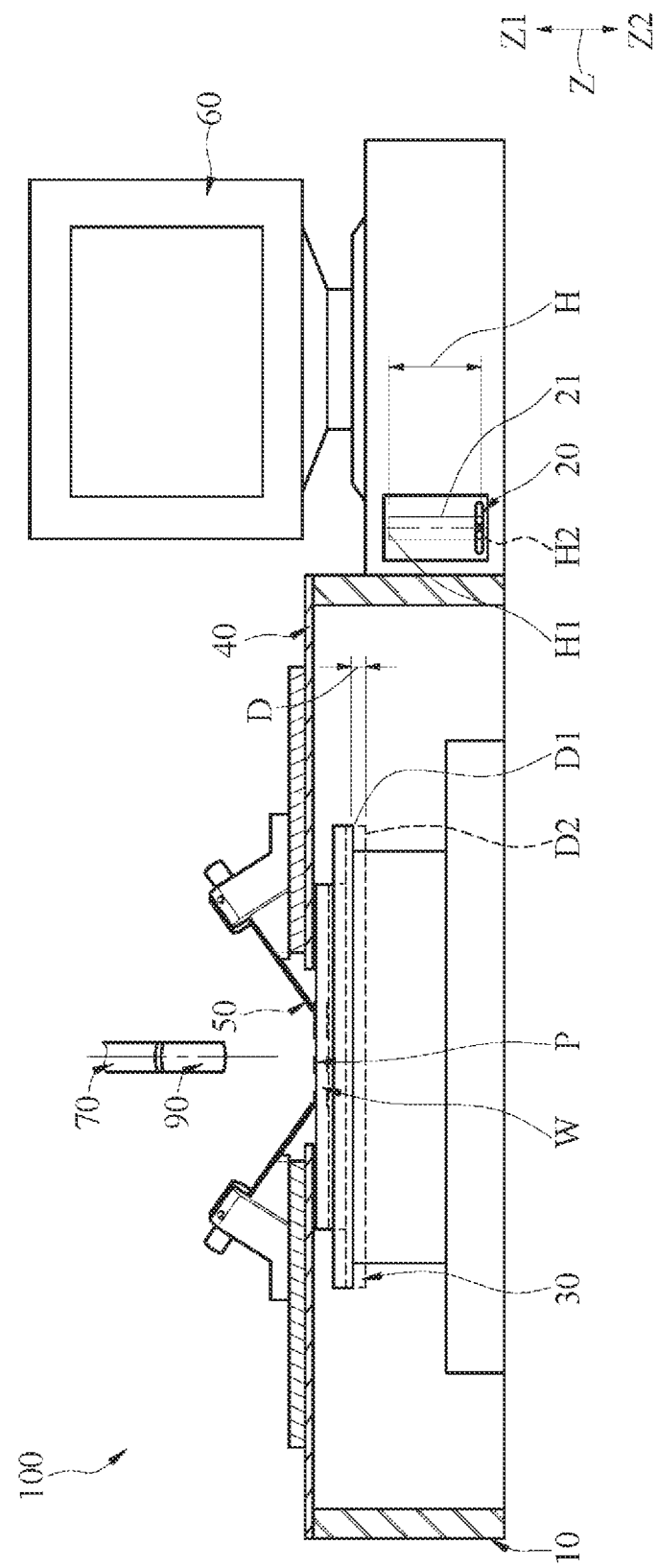
FIG. 9 is still another schematic diagram of a wafer probing system for implementing a wafer inspection method.

In another embodiment, referring to FIG. 6 to FIG. 8, there may alternatively be a nonlinear correlation between the change of the measurement signal corresponding to the movement of the control rod 20 and the displacement distance of the motorized chuck stage 30, as shown in FIG. 6 to FIG. 8. Specifically, the relative relationship between the change of the measurement signal corresponding to the movement of the control rod 20 and the displacement distance of the motorized chuck stage 30 is a curve. In this way, the displacement distance of the motorized chuck stage 30 and a change of the analog signal corresponding to the movement of the control rod 20 meet expectations. Herein, the curve of the relative relationship between the change of the measurement signal and the displacement distance of the motorized chuck stage 30 may be adjusted based on a requirement.

In another embodiment, in addition to controlling the relationship between the change of the measurement signal and the displacement distance of the motorized chuck stage 30 by using software, a displacement range (for example, a maximum displacement amount and a minimum displacement amount) of the motorized chuck stage 30 can be further limited, thereby meeting different hardware requirements.

In an embodiment, a plurality of control nodes is included between the upper limit position H1 and the lower limit position H2 of the displacement range H, each control node generates a different measurement signal value, and when a measurement signal value at the position where the control rod 20 is located is the same as the measurement signal value corresponding to the control node, the control signal can be generated. The foregoing control nodes may be physical position sensors (which output digital signals) or unphysical control nodes (analog signal values) that define a position based on a moving distance signal.

In an embodiment, the control nodes may be evenly disposed in the displacement range H. For example, the displacement range H has a range of ten centimeters, when the control nodes are evenly disposed in the displacement range H, measurement signal values at the positions at the intervals of one centimeter in the displacement range H conform to the measurement signal values corresponding to the control nodes, and a distance (one centimeter) between control nodes is defined as a moving distance segment. Herein, the displacement range H is divided into the moving distance segments corresponding to the quantity of the control nodes. Therefore, when the moving distance of the control rod 20 is determined to conform to a multiple of the moving distance segment, the control signal can be generated, and a proportion of the moving distance in the displacement range H is the same as the displacement distance of the motorized chuck stage 30 in the adjustment range D.

Herein, if the entire adjustment range D of the motorized chuck stage 30 has a range of 100 μm, the motorized chuck stage 30 may be correspondingly adjusted to be displaced for a distance of 10 μm by adjusting the control rod 20 to be displaced for a moving distance segment. In this way, in addition to limiting the control rod 20 to control displacement of the motorized chuck stage 30 each time based on a preset distance, it is defined in advance that adjustment of the control rod 20 each time correspondingly controls the displacement distance of the motorized chuck stage 30, and the operator may foreknow the adjusted displacement distance of the motorized chuck stage 30 by using times of adjusting the control rod 20, thereby improving operation convenience.

In addition, distribution of the positions of the control nodes corresponding to the control rod 20 is not limited to even distribution disclosed in the foregoing embodiments. In an embodiment, the control nodes in the displacement range H are not evenly distributed, a distribution density of the control nodes in the range closer to the lower limit position H2 is greater than a distribution density of the control nodes in the range closer to the upper limit position H1. In this way, when the position of the control rod 20 in the displacement range H is closer to the lower limit position H2, it indicates that the position of the motorized chuck stage 30 is closer to the probe 50. In this state, to prevent excessive feeding of the motorized chuck stage 30 from damaging the probe 50, the control nodes closer to the lower limit position H2 indicate a greater distribution density, and a distance of the control rod 20 to generate the control signal due to displacement is shorter. In addition to more finely controlling the displacement distance of the control rod 20, the position of the motorized chuck stage 30 can be correspondingly more accurately adjusted accordingly, thereby avoiding damage of the probe 50.

It may be learned from the foregoing embodiments of different distribution of the control nodes in the displacement range H that the control nodes may be adjusted to relatively change a displacement distance of the motorized chuck stage 30 driven by the control rod 20 moving each time, and the operator may adjust the control nodes due to different requirements or hardware limits.

Further, based on the foregoing descriptions, when more control nodes are required in the displacement range H, an architecture determining the position of the control rod 20 by using the analog signal is better than an architecture determining the position of the control rod 20 by using the digital signal. Because sensors need to be increased, corresponding to the quantity of the control nodes, on the hardware architecture determining the position of the control rod 20 by using the digital signal, when the quantity of the control nodes increases, costs of the hardware architecture determining the position of the control rod 20 by using the digital signal are higher. The hardware architecture determining the position of the control rod 20 by using the analog signal does not have a same problem.

In addition, in an embodiment, the displacement distance of the motorized chuck stage 30 may be further continuously detected, a synchronization signal is generated based on the displacement distance, and the camera stage 70 is controlled, based on the synchronization signal, to be synchronously displaced. In this way, the position of the motorized chuck stage 30 and a position of the camera stage 70 are synchronously changed, to ensure that the camera stage 70 can still maintain, after the motorized chuck stage 30 changes the position, focusing to obtain a clear image.

In this embodiment, continuous detection of the displacement distance of the motorized chuck stage 30 may be synchronously displayed on the display screen 60, so that the operator can learn the position and an adjustment state of the motorized chuck stage 30 in real time, thereby improving operation convenience, and accordingly reducing error operations.

In some embodiments, the camera stage 70 is fixed on the case 10 of the wafer inspection system 100 and remains static all the time. In order to make the camera stage 70 be able to take a clear picture of the wafer W supported on the motorized stage 30, the wafer inspection system 100 includes an objective lens module 90 disposed between the camera stage 70 and the motorized chuck stage 30 and optically coupled to the camera stage 70. The objective lens module 90 is connected to a micro motor and the micro motor is communicatively coupled to the controller 80. The objective lens module 90 can be driven by the micro motor along Z-axis based on instructions from the controller 80 to keep focusing on the wafer W when the motorized chuck stage 30 is on the move. The controller 80 generates the instructions according to the control signal generated by the sensor, and the sensor generates the control signal based on displacement of the control rod 20. In some embodiments, the objective lens module 90 is driven synchronously with movement of the motorized chuck stage 30.

In some embodiments, when the control rod 20 is not moving and the objective lens module 90 is static, the user can replace the objective lens module 90 with another one having different magnification.

In some embodiments, the display screen 60 can be a touch display screen, and the control rod 20 is not a physical component but a virtual control rod showing on the display screen 60. Users can move the virtual control rod between an upper limit position and a lower limit position displayed on the display screen 60 in the way of touch control.

Figure 10C:
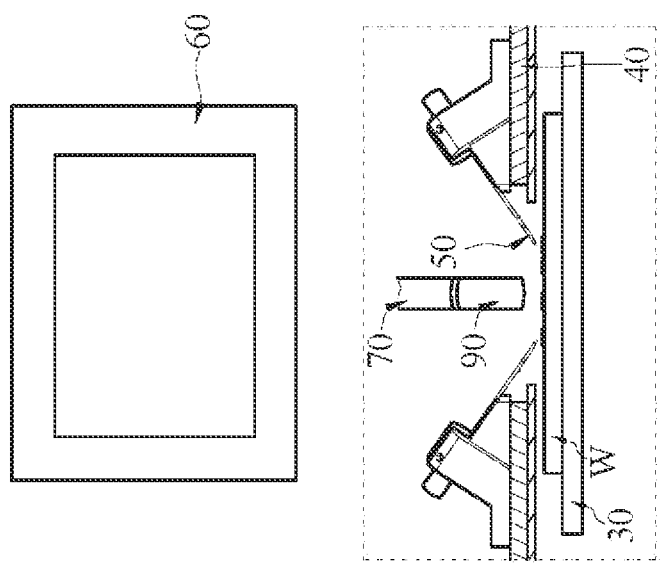
FIGS. 10A to 10C show how virtual position information of the probe platen are displayed on a display screen according to a relative position of the probe platen relative to the motorized chuck stage.
Figure 10B:
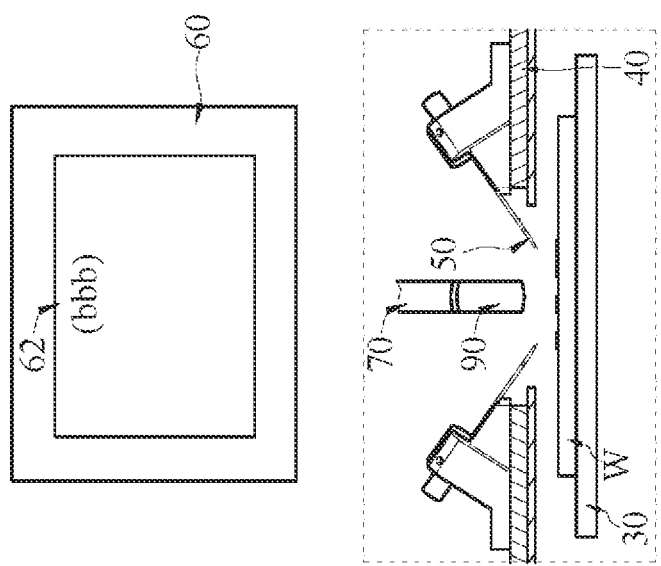
Figure 10A:
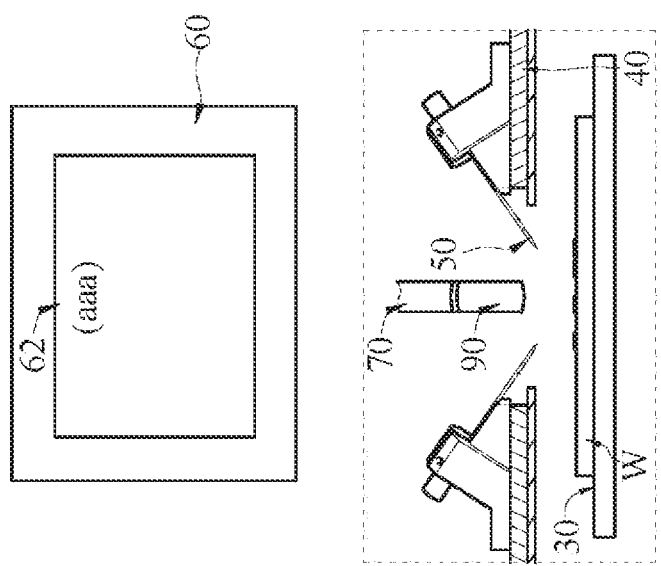

In some embodiments, as shown in FIGS. 10A to 10C, when the control rod 20 is at the higher limit position H1, the motorized chuck stage 30 is at the lowest position; and when the control rod 20 is at the lower limit position H2, the motorized chuck stage 30 is at the highest position which is an origin position of the motorized chuck stage 30. When the control rod 20 is moved by the user, the display screen 60 will keep displaying a distance information 62 that the motorized chuck stage 30 has been moved away from its origin position, and it helps the user aware if the tip of the probe 50 is about to contact the wafer W disposed on the motorized chuck stage 30.

In a probe apparatus, the probe platen 40 is usually much heavier than the motorized chuck stage 30, such that it needs higher power and more sturdy mechanism to make the probe platen 40 move than the motorized chuck stage 30. In the present invention, the moving direction of the control rod 20 is opposite to the moving direction of the motorized chuck stage 30, so the users will feel that they are moving the probe platen 40 downward when they are moving the control rod 20 from the upper limit position H1 to the lower limit position H2, and not aware it is the motorized chuck stage 30 to be lifted up.

In some embodiments, as shown in FIG. 10C, when the control rod 20 is at the lower limit position H2, the display screen 60 does not show the distance information 62. In other words, only when the control rod 20 is not located at the lower limit position H2, the display screen 60 will show the distance information 62. Because when the control rod 20 is at the lower limit position H2, the motorized chuck stage 30 is at its highest position (origin position). It cannot provide any benefit to display distance information 62 on the display screen 60 when the motorized chuck stage 30 is at its origin position.

In some embodiments, the user can only use the control rod 20 to control the motorized chuck stage 30 to rise to a specific position where the tip of the probe 50 is still not in contact with the wafer W. In other words, when the control rod 20 is at the lower limit position H2, the surface of the wafer W is only close to the tip of the probe 50, but not in contact with it. When the control rod 20 is at the lower limit position H2, the user can finely control the motorized chuck stage 30 to rise to a further higher position by other control manners. For example, the user can finely control the motorized chuck stage 30 to rise by touch-controlling an graphical user interface displaying on the display screen 60 until the surface of the wafer W is in contact with the tip of the probe 50.

Figure 11:
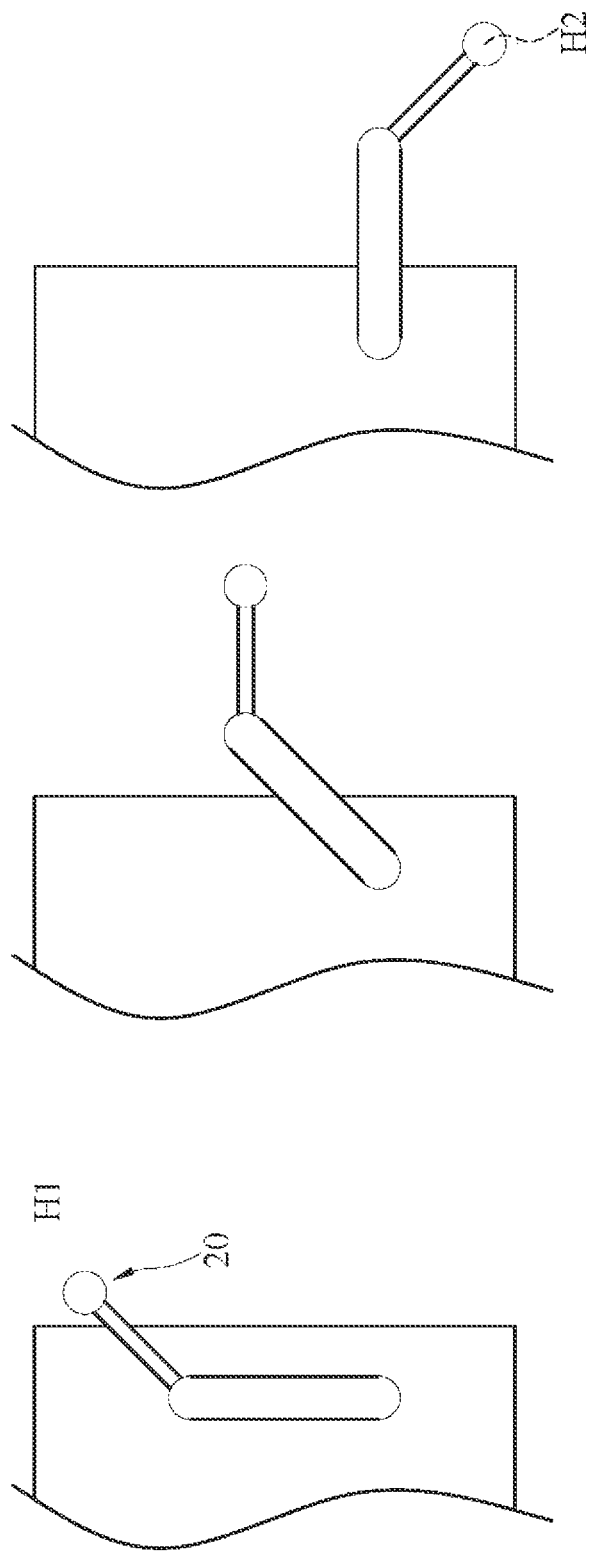
FIG. 11 is a schematic diagram showing the control rod can be retracted inside the case when it is at the upper limit position H1.

In some embodiments, as shown in FIG. 11, the control rod 20 can be partially or fully retracted inside the case 10 when it is at the upper limit position H1.

In some embodiments, the control rod 20 is a physical component disposed on the case 10 of the wafer probing system 100.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer inspection method, wherein a motorized chuck stage is controlled by a control rod to be displaced between an upper position and a lower position of an adjustment range along a Z-axis direction, to change a relative position of a wafer on the motorized chuck stage relative to a probe, and the control rod is capable of being moved between an upper limit position and a lower limit position in a displacement range by a user, wherein the motorized chuck stage and a tip of the probe are disposed inside of a case and the control rod is disposed outside of the case, the wafer inspection method comprising:

determining a position of the control rod in the displacement range based on a measurement signal;

determining a first moving direction of the control rod and a moving distance of the control rod based on a change of the measurement signal;

generating a control signal based on the moving distance corresponding to the position of the control rod;

controlling, based on the control signal, the motorized chuck stage to be displaced along a second moving direction opposite to the first moving direction of the control rod; and controlling, based on the control signal or a displacement of the motorized chuck stage, an objective lens module to keep focusing on the wafer when the motorized chuck stage is on the move so as to obtain a clear image wherein the objective lens module is disposed between a camera stage and the motorized chuck stage, and the objective lens module is optically coupled to the camera stage.

2. The wafer inspection method according to claim 1, wherein the control rod is a virtual control rod movable between an upper position and a lower position displayed on a touch display screen.

3. The wafer inspection method according to claim 1, further comprising:

displaying a current distance between a probe platen and the motorized chuck stage on a display screen.

4. The wafer inspection method according to claim 1, further comprising:

detecting a current position of the control rod; and displaying a current position information of the motorized chuck stage on a display screen.

5. The wafer inspection method according to claim 1, wherein the objective lens module is driven synchronously with movement of the motorized chuck stage.

6. The wafer inspection method according to claim 1, wherein both the probe and a probe platen are static, the wafer inspection method further comprising:

displaying, based on a relative position of the control rod, a displacement information of the motorized chuck stage relative to its origin position on a display screen.

7. A wafer probing system, comprising:

a case;

a motorized chuck stage, disposed inside of the case and adapted to support a wafer;

a probe, disposed on a probe platen above the motorized chuck stage and fixed on the case through the probe platen, wherein a tip of the probe is located inside of the case;

a camera stage, configured to take a picture of the wafer supported on the motorized chuck stage;

an objective lens module, disposed between the camera stage and the motorized chuck stage, optically coupled to the camera stage and connected to a micro motor, the objective lens module is adapted to keep focusing on the wafer when the motorized chuck stage is on the move;

a control rod, disposed outside of the case and capable of being moved between an upper limit position and a lower limit position by a user, and the control rod electrically connects with the controller;

a sensor, communicatively coupled to the control rod, when the position of the control rod is changed, the sensor generates a control signal;

a controller, communicatively coupled to the motorized chuck stage, the camera stage, the control rod, the micro motor and the sensor, the controller is configured to control, based on the control signal, the motorized chuck stage to move along a Z-axis direction, and the lens module to keep focusing on the wafer when the motorized chuck stage is on the move so as to obtain a clear image; and a display screen, communicatively coupled to the camera stage, and the display screen includes a user interface, the user interface is adapted to show a current image of the wafer when the motorized chuck stage is on the move.

8. A wafer inspection method, wherein a first element is controlled by a second element to be displaced between an upper position and a lower position of an adjustment range along a Z-axis direction, to change a relative position of a wafer relative to a probe disposed on a probe platen, and the second element is capable of being moved between an upper limit position and a lower limit position in a displacement range by a user, the wafer inspection method comprising:

determining a position of the second element in the displacement range based on a measurement signal;

determining a first moving direction of the second element based on a change of the measurement signal;

generating a control signal based on the first moving direction of the second element;

controlling, based on the control signal, the first element to be moved along a second moving direction opposite to the first moving direction of the second element; and controlling, based on the control signal or a displacement of the first element, a lens module of a camera to keep focusing on the wafer when the first element is on the move so as to obtain a clear image.

9. The wafer inspection method according to claim 8, wherein the first element is a motorized chuck stage.

10. The wafer inspection method according to claim 9, wherein the second element is a virtual control rod movable between an upper position and a lower position displayed on a touch display screen.

11. The wafer inspection method according to claim 8, further comprising:

displaying a current distance between the probe platen and the first element on a display screen.

12. The wafer inspection method according to claim 8, further comprising:

detecting a current position of the second element; and displaying a current distance information between the probe platen and the first element on a display screen.

13. The wafer inspection method according to claim 8, wherein the lens module is driven synchronously with movement of the first element.

14. The wafer inspection method according to claim 8, wherein both the probe and the probe platen are static, the wafer inspection method further comprising:

displaying, based on a relative position of the control rod, a displacement information of the motorized chuck stage relative to its origin position on a display screen.

* * * * *